United States Patent [19]

Stein

[11] 3,847,686

[45] Nov. 12, 1974

[54] METHOD OF FORMING SILICON EPITAXIAL LAYERS

[75] Inventor: Leonard Stein, Dewitt, N.Y.

[73] Assignee: General Electric Company, Schenectady, N.Y.

[22] Filed: Feb. 15, 1973

[21] Appl. No.: 332,774

Related U.S. Application Data

[63] Continuation of Ser. No. 40,903, May 27, 1970, abandoned.

[52] U.S. Cl.............. 148/175, 117/106 A, 117/212, 117/215, 148/174, 148/191, 156/17

[51] Int. Cl......... H01l 7/36, C23c 11/00, H01l 5/00

[58] Field of Search.................... 148/174, 175, 191; 117/106 A, 212, 215; 156/17

[56] References Cited

UNITED STATES PATENTS

| | | | |
|---|---|---|---|
| 3,243,323 | 3/1966 | Corrigan et al. | 148/175 |
| 3,508,962 | 4/1970 | Manasevit et al. | 117/106 X |
| 3,522,164 | 7/1970 | Sumner | 148/175 X |
| 3,523,838 | 8/1970 | Heidenreich | 148/175 |
| 3,660,180 | 5/1970 | Wajda | 148/175 |

OTHER PUBLICATIONS

Gupta et al, "Silicon Epitaxial Layers . . . Interface Impurity Profiles," J. Electrochem. Soc., Vol. 116, No. 11, Nov. 1969, pp. 1561–1565.

Joyce et al., "Impurity Redistribution Processes in Epitaxial Silicon Layers," J. Electrochem. Soc., Vol. 112, No. 11, Nov. 1965, pp. 1,100–1,106.

Finch et al., "Structure and Origin of Stacking Faults in Epitaxial Silicon," J. Applied Physics, Vol. 34, No. 2, Feb. 1963, pp. 406–415.

Rynyan, W. R., "Silicon Semiconductor Technology," Textbook–McGraw–Hill Book Co., N.Y., 1965, pp. 69–73.

*Primary Examiner*—L. Dewayne Rutledge
*Assistant Examiner*—W. G. Saba
*Attorney, Agent, or Firm*—Julius J. Zaskalicky; Joseph T. Cohen; Jerome C. Squillaro

[57] ABSTRACT

This invention relates to a method of forming a silicon epitaxial layer on the surface of a body of silicon material including regions of modified conductivity type without significantly distorting or displacing the prearranged boundaries of these regions. This is accomplished by preconditioning the surface of the silicon body in the presence of hydrogen at a temperature not exceeding 1,000°C for between 5 to 30 minutes. Immediately following this preconditioning, a first silicon epitaxial layer is deposited on the preconditioned surface while maintaining the silicon body at a temperature not exceeding 1,000°C. Subsequently, a second silicon epitaxial layer is deposited over the first silicon epitaxial layer while maintaining the silicon body at a temperature not exceeding 1,250°C.

10 Claims, 2 Drawing Figures

METHOD OF FORMING SILICON EPITAXIAL LAYERS

This is a continuation of application Ser. No. 40,903, filed May 27, 1970, now abandoned.

This invention relates to a method of forming a silicon expitaxial layer on a monocrystalline silicon semiconductor body without significantly disturbing the locations of the boundaries of regions of modified conductivity previously included in the body.

It is, oftentimes, desirable in the manufacturing of semiconductor devices to form a silicon epitaxial layer on the top surface of a semiconductor body of monocrystalline silicon material having therein previously formed regions whose conductivity, in respect to either resistivity level or conductivity type, has been modified relative to such properties of the parent crystal. These regions have prearranged boundaries and their modified conductivity is determined by the type and amount of dopant impurities used in forming these regions. Heretofore, the high temperatures (i.e., greater than 1,200°C) needed to precondition the semiconductor body (i.e., remove unwanted contaminants and oxides from the surface of the silicon body by heating in hydrogen atmosphere) and epitaxially deposit these silicon epitaxial layers have produced serious problems such as the prearranged boundaries becoming distorted. It was believed, however, that unless a preconditioning treatment at a temperature of at least 1,200°C was used, a subsequently grown silicon epitaxial layer would contain an undesirable number of crystal imperfections such as bumps, pits and stacking faults.

Whenever a silicon source of either silicon tetrachloride or silane is used, a high temperature hydrogen bake at 1,200°C or greater is generally used to precondition the top surface of the semiconductor body immediately prior to the deposition of the silicon epitaxial layer on the silicon body. This preconditioning treatment causes the dopant impurities, which are already present and situated within the predetermined boundaries of the regions of modified conductivity, to diffuse across the top surface of the silicon body. This lateral diffusion subsequently may cause such dopant impurities to become entrapped in the silicon epitaxial layer, thereby extraneously affecting the desired properties of the epitaxial layer. This entrappment occurs by the overgrowth of epitaxial silicon atoms on top of the dopant impurity thereby "locking in" the dopant impurity in the epitaxial layer. It has been estimated that, in the case of boron, this mobile dopant impurity diffuses laterally across the surface of the semiconductor at a rate at least 50 times greater than this same impurity can diffuse through the bulk semiconductor material of the body. The deleterious effects of the lateral diffusion of the dopant impurities have been increased when silicon tetrachloride was used as a silicon source during the initial portion of the epitaxial deposition cycle because it has been the practice to maintain the silicon body at a temperature of around 1,200°C during the entire epitaxial deposition cycle from such a source, in order to get good crystal structure. The result is that the predetermined boundaries of the previously formed regions are undesirably distorted and displaced, to the extent that the electrical characteristics of the resulting semiconductor device are seriously impaired. Another preconditioning treatment of the silicon body surface prior to epitaxial deposition which causes the above deleterious effects is the practice of vapor etching the silicon surface at 1,300°C using a halide vapor phase etchant.

A typical and readily identifiable example of the deleterious effects of distorted modified-conductivity regions is illustrated in the case of integrated circuit structures having patterned regions prediffused with arsenic and boron in a silicon body so as to constitute high conductivity collector bodies and junction isolation for transistors, diodes, resistors and the like. Redistribution of the prediffused impurities in these regions results in reduced isolation breakdown voltages, undesired compensation of the collector region resistivity, and sometimes shorting of the resistor elements to ground. According to the present invention a silicon epitaxial layer can be put down over such pre-diffusion regions without significantly disturbing the previously formed boundaries of the donor-doped or acceptor-doped regions because both the preconditioning and initial epitaxial deposition steps of the present invention are performed at temperatures never exceeding 1,000°C.

Accordingly, it is an object of my invention to provide an improved method of epitaxially depositing a silicon epitaxial layer on a semiconductor body having therein previously formed regions of modified conductivity type without appreciably distorting the boundaries of such regions.

Another object is to provide a method of the foregoing character utilizing epitaxial deposition of silicon at temperatures no higher than 1,000°C.

These and other objects of this invention will be apparent from the following description and the accompanying drawing, wherein.

Briefly, this invention provides for the formation of a silicon epitaxial layer on the surface of a body of silicon material containing previously formed predetermined regions of modified conductivity type without significantly distorting or displacing the prearranged boundaries of such regions. This is accomplished by preconditioning the surface of the silicon body in the presence of hydrogen atmosphere at a temperature not exceeding 1,000°C for between 5 to 30 minutes. Immediately following this preconditioning treatment, an initial silicon epitaxial layer is deposited on the preconditioned surface while maintaining the silicon body at a temperature not exceeding 1,000°C. After an initial thickness of 0.5 to 2 microns of silicon has been deposited on the surface of the silicon body, the temperature of the body is raised to a temperature in the range of 1,100° to 1,250°C and maintained there until the remainder of the desired thickness of silicon is grown.

Figure 1:
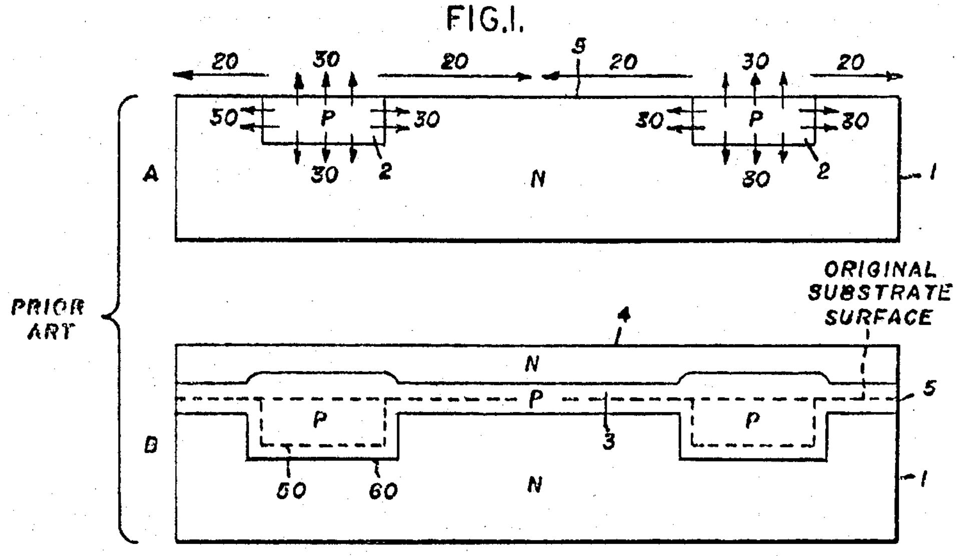
FIG. 1A is an enlarged cross-sectional view of a body of semiconductor material including regions of modified conductivity type, illustrating the effects of the prior art practice of heating the body to 1,200°C in the presence of hydrogen.
FIG. 1B is an enlarged cross-sectional view of the body of semiconductor material shown in FIG. 1A after an epitaxial layer of semiconductor material has been formed on its surface using techniques known in the prior art.

Referring to FIG. 1A there is shown a semiconductor body of silicon material which may be, for example, N or P type conductivity. Previously formed in the semiconductor body 1 by techniques well known to those skilled in the art are regions 2 of modified conductivity type. These regions 2 have either an opposite conductivity type to that of the semiconductor body 1 or have the same conductivity type as the body 1 but a different resistivity value. The desired modification of conductivity type is determined by the type and amount of dopant impurities used to form regions 2.

In the prior art of forming an epitaxial layer of silicon on the top surface 5 of the body 1, heretofore, it has been thought necessary to heat the body 1 to a temperature between 1,200° and 1,350° in the presence of hydrogen to remove extraneous deposits such as oxides and other contaminants therefrom. It was believed in the prior art that this was the only way epitaxial layers which were substantially free of pits, bumps and stacking faults could be grown on semiconductor surfaces, even when the epitaxial layers were subsequently formed at lower temperatures (i.e., between 1,000° and 1,200°C). Temperatures between 1,200° and 1,350°C, however, introduce the disadvantage of causing the dopant impurities in region 2, which is typically formed by diffusion techniques well known to those skilled in the art, to move around on the top surface 5 as well as in the bulk material of the body 1. This movement is illustrated by the arrows 20 and 30 in FIG. 1A respectively. Typical surface concentration values of region 2 for boron, for example, would fall between $10^{19}-10^{20}$ atoms per cubic centimeter.

It has been observed that the lateral diffusion rate of the dopant impurity once it reaches the top surface 5 as illustrated by the arrows 20 is estimated in the case of boron to be at least 50 times as great across the top surface 5 of the body as compared to its bulk diffusion rate through the body as illustrated by the arrows 30. It is noted that some dopant impurities are more readily able to leave the boundaries of region 2 because they are more volatile, phosphorous, for example, is more volatile than boron.

The primary difficulty with the lateral movement of the dopant impurities from the modified conductivity regions 2 across the top surface 5 is that when an epitaxial layer 4 of silicon is being formed thereon, the dopant impurities become entrapped in the epitaxial layer 4 as illustrated by 3 in FIG. 1B. This results in the original prearranged boundaries of the regions 2 becoming distorted. For purposes of illustration, this is best shown in FIG. 1B by comparing the dotted lines 50 indicating the original boundaries of region 2 with the solid lines 60 of the same region which reflects its new boundaries upon completion of the preconditioning and epitaxial deposition steps.

Figure 2:
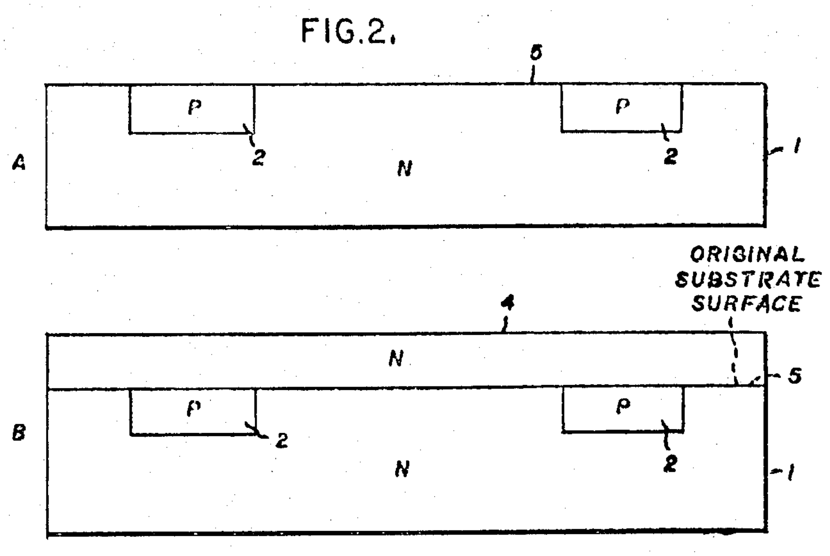
FIG. 2A is an enlarged cross-sectional view of a body of semiconductor material similar to that of FIG. 1A prior to epitaxial deposition treatment in accordance with the present invention.
FIG. 2B is an enlarged cross-sectional view of the body of semiconductor material shown in FIG. 2A after expitaxial deposition treatment in accordance with the present invention.

One preferred product of the invention which overcomes the above-mentioned difficulties is best illustrated in FIGS. 2A and 2B. FIG. 2A shows a structure similar to that of FIG. 1A with the exception that there has been substantially no movement of the dopant impurities beyond the original boundaries of the modified conductivity regions 2 during the preconditioning treatment. This improvement is accomplished by maintaining the preconditioning temperature to which the semiconductor body 1 is subjected to in the presence of an hydrogen atmosphere, at a temperature between 800° and 1,000°C for between 5 and 30 minutes.

Immediately upon completion of my preconditioning step the silicon epitaxial layer 4 should be formed on the top surface 5 of the semiconductor body 1 as shown in FIG. 2B. The initial portion of the epitaxial deposition is accomplished while maintaining the temperature of the semiconductor body at 1,000°C or less. This greatly minimizes the mobile impurity dopants present in region 2 from diffusing across the top surface 5 and then becoming entrapped in the epitaxial layer 4.

It has been found that although it is desirable to maintain the temperature of the semiconductor body 1 as low as possible, below 900°C the crystal structure of the deposited epitaxial layer becomes unacceptable as evidenced by an abundance of stacking faults and/or regions of polycrystallinity. Typically, a good stacking fault count is below 400 stacking faults per centimeter squared. Therefore, for best overall results it is necessary to compromise the desirability of using a low epitaxial temperature deposition and the need to maintain a good epitaxial crystal structure. Following are some examples of various alternatives of my invention which may be used to form good epitaxial layers without the disadvantages previously described.

EXAMPLE I a. A silicon wafer having a structure identical to wafer 1 shown in FIG. 2A was preconditioned (i.e., treated to remove contaminants and oxides from the surface of the wafter) by heating the wafer in an atmosphere of 100 percent hydrogen for 7 minutes at 1,000°C. The time the wafer was held at 1,000°C was varied from 5 to 30 minutes with no appreciable difference in results.

b. A small portion of the silicon wafer was broken off, angle lapped and stained in a conventional hydrofluoric-nitric acid stain to determine if the boundaries of the regions of opposite conductivity type had moved or had become distorted. An examination under a microscope of this portion of the wafer showed no significant lateral movement of the boundaries had occurred. If the regions examined has been of the same conductivity type but had a different resistivity value than the parent wafer then the test for lateral movement would be accomplished by electrical measurement.

c. The remaining portion of the wafer was then heated to 1,000°C in a gaseous mixture of silicon tetrachloride ($SiCl_4$) and hydrogen source (approximately 0.5 mol percent in $H_2$) for 3 minutes. This resulted in the formation on the wafer of a silicon epitaxial layer of 0.75 microns thickness (i.e., the resultant epitaxial growth rate under these conditions is approximately 0.25 microns per minute).

d. A second sample portion of the silicon wafer was removed and prepared for examination using the technique described in paragraph (b). Again the examination under the microscope of this portion of the wafer showed no significant lateral movement of the boundaries between regions of opposite conductivity type had occured.

EXAMPLE II a. A silicon wafer having a structure identical to wafer 1 shown in FIG. 2A was preconditioned (i.e., treated to remove contaminants and oxides from the surface of the wafer) by heating the wafer in an atmosphere of 100 percent hydrogen for 7 minutes at 1,000°C.

b. The wafer was then immediately heated to 1,000°C in the presence of a silicon tetrachloride ($SiCl_4$) source (approximately 0.5 mol percent in $H_2$) for 3 minutes which resulted in a silicon epitaxial layer of 0.75 microns thickness. This thickness may vary slightly (i.e., between 0.5 and 2 microns) as long as the initial surface is sufficiently sealed, so that, no significant change in the lateral movement of the boundaries of the modified conductivity regions occurs during subsequent processing steps. It has been found that although thicker epitaxial layers can be grown at 1,000°C using silicon tetrachloride, after this initial thickness (i.e., 0.5 to 2 microns) of epitaxial silicon is formed, a number of disadvantages exists if growth is continued at this temperature. For example, first the rate of growth of the silicon epitaxial layer is slower at lower temperatures, second the crystal structure of the silicon epitaxial layer is more likely to have more stacking faults when formed at lower temperatures and finally the pattern outline of the boundaries of the modified conductivity type, as viewed from the top of the epitaxial layer, become washed out (i.e., the pattern outline cannot readily be seen at the surface of the newly grown epitaxial layer thereby making it very difficult to register subsequent patterns needed to form the device). Therefore, to overcome these disadvantages, where thicker epitaxial layers are desired, the temperature of the silicon body was raised to 1,150°C after the initial epitaxial layer of silicon was formed at 1,000°C. The rate of epitaxial deposition at 1,150°C is approximately 0.5 microns per minute. Temperatures between 1,100° and 1,250°C were also used to form the thicker epitaxial layer with no appreciable difference in results except the rate of epitaxial deposition was increased as the temperature of the body was increased. A silicon source of 0.2 mol percent silane in hydrogen was also tried at 1,000°C with no appreciable difference in results except that the pattern "wash out" problem which results when using silicon tetrachloride entirely at 1,000°C does not occur. The use of silane, however, produces a number of disadvantages not present when silicon tetrachloride is used. For example, silane involves a higher cost, a greater safety hazzard, and less wafer to wafer uniformity of epitaxial thickness and resistivity.

c. A small portion of the silicon wafer was broken off, angle lapped and stained as described in Example I(b). An examination of the resulting structure showed no significant lateral movement of the boundaries of the regions of opposite conductivity type. There was some vertical movement of the boundaries in the bulk material of the wafer and in the newly formed epitaxial layer which generally results after the epitaxial deposition was raised to 1,150°C. This movement, however, did not result in any deleterious effects on the electrical characteristics of the device.

It will be appreciated by those skilled in the art that my invention may be carried out in various ways and may take various forms and embodiments other than the illustrative embodiments heretofore described. Accordingly, it is to be understood that the scope of the invention is not limited by the details of the foregoing description, but will be defined in the following claims.

What I claim as new and desire to secure by Letters Patent of the United States is:

1. An improved method of forming a silicon epitaxial layer on one major surface of a silicon semiconductor body including a modified conductivity region having prearranged boundaries, without significantly disturbing the location of said boundaries, comprising preconditioning said surface to receive said epitaxial layer by heating the silicon body in hydrogen to a temperature not exceeding 1,000°C for between 5 to 30 minutes to remove extraneous matter therefrom, and immediately following such preconditioning depositing from a silicon source selected from the group of silicon tetrachloride and silane an epitaxial layer of silicon on said surface while maintaining said semiconductor body at a temperature not exceeding 1,000°C.

2. An improved method of forming an epitaxial layer of silicon as defined in claim 1, an additional step of increasing the temperature during the epitaxial deposition of the silicon layer, after some predetermined initial thickness of silicon has been deposited on the one major face at 1,000°C or less, to a temperature in the range of between 1,100° and 1,250°C and complete the formation of the epitaxial layer at this temperature.

3. An improved method of providing a silicon epitaxial layer on a silicon body, while substantially reducing the lateral diffusion across the surface of a semiconductor body of dopant impurities from modified conductivity type regions formed in the semiconductor body, comprising preconditioning said surface to receive said epitaxial layer by heating the silicon body in hydrogen to a temperature not exceeding 1,000°C for between 5 to 30 minutes to remove extraneous matter therefrom, and immediately following such preconditioning depositing from a silicon source of silicon tetrachloride an epitaxial layer of silicon on said surface while maintaining said semiconductor body at a temperature not exceeding 1,000°C.

4. An improved method of forming an epitaxial layer of silicon as defined in claim 3, an additional step of increasing the temperature during the epitaxial deposition of the silicon layer, after some predetermined initial thickness of silicon has been deposited on the one major face at 1,000°C or less, to a temperature in the range of between 1,100° and 1,250°C and complete the formation of the epitaxial layer at this temperature.

5. The method of claim 1 in which silicon is deposited from said source to a thickness to seal adequately the dopant impurities in said modified conductivity region within the bulk of the resultant semiconductor body.

6. The method of claim 1 in which the thickness of said epitaxial layer is between 0.5 and 2 microns.

7. The method of claim 1 in which said modified conductivity region is of P-type conductivity in which the dopant impurity is boron.

8. The method of claim 3 in which silicon is deposited from said source to a thickness to seal adequately the dopant impurities in said modified conductivity region within the bulk of the resultant semiconductor body.

9. The method of claim 3 in which the thickness of said epitaxial layer is between 0.5 and 2 microns.

10. The method of claim 3 in which said modified conductivity region is of P-type conductivity in which the dopant impurity is boron.

* * * * *